United States Patent
Staudinger et al.

(10) Patent No.: US 7,440,731 B2
(45) Date of Patent: Oct. 21, 2008

(54) POWER AMPLIFIER WITH VSWR DETECTION AND CORRECTION FEATURE

(75) Inventors: Joseph Staudinger, Gilbert, AZ (US); Benjamin R. Gilsdorf, Phoenix, AZ (US); David A. Newman, Tempe, AZ (US); George B. Norris, Gilbert, AZ (US); Gary W. Sadowniczak, Phoenix, AZ (US); Richard E. Sherman, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 405 days.

(21) Appl. No.: 11/191,687

(22) Filed: Jul. 27, 2005

(65) Prior Publication Data

US 2007/0026838 A1     Feb. 1, 2007

(51) Int. Cl.
*H01Q 11/12* (2006.01)
*H04B 1/04* (2006.01)

(52) U.S. Cl. ............... 455/91; 455/126; 455/127.1
(58) Field of Classification Search ... 455/127.1–127.3, 455/151.1, 126
See application file for complete search history.

(56) References Cited

U.S. PATENT DOCUMENTS

| | | | | |
|---|---|---|---|---|
| 3,641,451 A * | 2/1972 | Hollingsworth et al. | ..... | 330/134 |
| 5,038,112 A * | 8/1991 | O'Neill | ..... | 330/207 P |
| 5,278,994 A * | 1/1994 | Black et al. | ..... | 455/126 |
| 5,678,209 A * | 10/1997 | Strakovsky | ..... | 455/126 |
| 6,018,650 A * | 1/2000 | Petsko et al. | ..... | 455/234.1 |
| 6,329,880 B2 * | 12/2001 | Akiya | ..... | 330/298 |
| 6,600,307 B2 * | 7/2003 | Turski et al. | ..... | 324/95 |
| 6,757,526 B1 * | 6/2004 | Sharp et al. | ..... | 455/127.1 |
| 6,895,225 B1 * | 5/2005 | Talvitie et al. | ..... | 455/78 |
| 7,071,776 B2 * | 7/2006 | Forrester et al. | ..... | 330/129 |
| 7,103,329 B1 * | 9/2006 | Thon | ..... | 455/126 |
| 7,151,382 B1 * | 12/2006 | Kean et al. | ..... | 324/683 |
| 2002/0094791 A1 * | 7/2002 | Pehlke et al. | ..... | 455/115 |
| 2005/0227640 A1 * | 10/2005 | Haque et al. | ..... | 455/126 |

OTHER PUBLICATIONS

T. Sowlati et al., "Polar Loop Transmitter," Skyworks Solutions, Inc. at the UCSD Power Amplifier Workshop (Fall 2004).

* cited by examiner

*Primary Examiner*—Simon D Nguyen
(74) *Attorney, Agent, or Firm*—Ingrassia, Fisher & Lorenz, P.C.

(57) ABSTRACT

A radio frequency ("RF") power amplifier circuit as described herein is configured to detect and measure an output load mismatch and to adjust the operating characteristics of the RF power amplifier to reduce output signal distortion. The circuit includes a directional RF signal coupler that obtains a coupled reflected RF signal that is indicative of the output load mismatch. The coupled reflected RF signal is processed to generate one or more bias control signals for the RF power amplifier. In operation, a mismatch condition will result in a measurable coupled reflected RF signal and a corresponding reduction in output power from the RF power amplifier. Ultimately, the output power control mechanism strives to maintain the RF power amplifier within a linear operating range.

17 Claims, 2 Drawing Sheets

US 7,440,731 B2

POWER AMPLIFIER WITH VSWR DETECTION AND CORRECTION FEATURE

TECHNICAL FIELD

The present invention relates generally to power amplifier circuits. More particularly, the present invention relates to a radio frequency ("RF") power amplifier having an output power control feature.

BACKGROUND

The prior art is replete with RF power amplifiers suitable for use with numerous practical applications. For example, mobile telephones and other wireless communication devices are common applications for RF power amplifiers. In a mobile telephone, the antenna presents a load to the RF power amplifier contained in the transmitter, and the load changes in response to various antenna operating effects and/or environmental conditions. Consequently, the changing load may result in a mismatch for the RF power amplifier. The performance of the RF power amplifier, in particular the linearity of its RF output signal, tends to be strongly dependent upon its loading condition. This practical operating characteristic applies to single-ended amplifier types and to more complex architectures, such as full polar amplifiers. Generally, the variation in loading can result in degradation of the AM-AM response of a full polar amplifier and/or an increase in AM-PM conversion, both of which lead to signal degradation (higher output RF spectrum ("ORFS") and an increase in error vector magnitude ("EVM")).

Existing power amplifier architectures may employ closed feedback techniques to reduce variations in output power generated by the amplifiers. Such closed loop architectures do not adjust output power based upon dynamically changing load conditions. Moreover, existing closed loop solutions tend to add significant transmitter current for feedback purposes, and such solutions do not directly detect output load mismatches. These limitations can lead to undesirable results in practical applications.

Accordingly, it is desirable to have a circuit and a technique for adjusting the output generated by an RF power amplifier, where such adjustment is responsive to changing output load conditions. In addition, it is desirable to have an RF power amplifier circuit that is capable of detecting the presence of an output load mismatch (e.g., high voltage standing wave ratio) and correcting output signal distortions caused by output load mismatches. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

Figure 1:
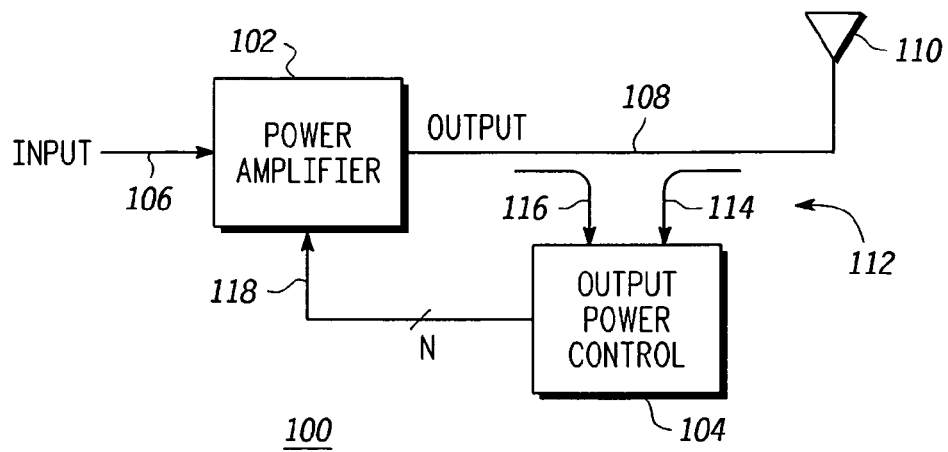
FIG. 1 is a schematic representation of an RF power amplifier circuit configured in accordance with an example embodiment of the invention.

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or logical block components and various processing steps. It should be appreciated that such block components may be realized by any number of hardware, software, and/or firmware components configured to perform the specified functions. For example, an embodiment of the invention may employ various integrated circuit components, e.g., memory elements, transistors, logic elements, look-up tables, or the like, which may carry out a variety of functions under the control of one or more microprocessors or other control devices. In addition, those skilled in the art will appreciate that the present invention may be practiced in conjunction with any number of practical circuits, subsystems, or systems, and that the RF power amplifier deployment described herein is merely one exemplary application for the invention.

For the sake of brevity, conventional techniques related to RF power amplifier design, RF signal coupling, RF signal detection, and other functional aspects of the circuits (and the individual operating components of the circuits) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

The following description refers to elements or features being "connected" or "coupled" together. As used herein, unless expressly stated otherwise, "connected" means that one element/feature is directly joined to (or directly communicates with) another element/feature, and not necessarily mechanically. Likewise, unless expressly stated otherwise, "coupled" means that one element/feature is directly or indirectly joined to (or directly or indirectly communicates with) another element/feature, and not necessarily mechanically. Thus, although the circuit schematics shown herein depict example arrangements of elements, additional intervening elements, devices, features, or components may be present in an actual embodiment (assuming that the functionality of the circuits are not adversely affected).

An RF electronic circuit as described herein employs a technique for improving power amplifier characteristics in response to load mismatch effects, resulting in better amplifier linearity. Under load mismatch conditions, the circuit detects the presence of a reflective load using a directional coupler. The reflected RF signal is detected to generate one adjustment signal (e.g., a voltage), which is proportional to the magnitude of the reflection coefficient. Additionally, the forward incident RF output signal is detected to generate another adjustment signal. In the example embodiment, the two adjustment signals are independently amplified/attenuated and applied in a feedback loop to adjust the bias of the amplifier. Operationally, as the reflected RF signal increases due to high VSWR conditions, the feedback loop adjusts the bias voltage and/or current of one or more amplifier stages. This effectively results in less AM-AM compression, thereby improving output signal quality while reducing variations in incident power as a function of VSWR. Using this technique, the loop parameters can be properly adjusted to reduce gain compression of peak envelope excursions under load mismatch conditions. Consequently, output signal quality is enhanced, as reflected in improved ORFS and EVM measurements.

FIG. 1 is a schematic representation of an RF power amplifier circuit 100 configured in accordance with an example embodiment of the invention. Circuit 100 generally includes an RF power amplifier 102 and an output power control architecture 104 coupled to RF power amplifier 102. In this example, which is suitable for use with a wireless communication device, RF power amplifier 102 receives an input signal 106 and generates an RF output signal 108 having desired output characteristics. In practice, the frequency, amplitude, phase, and other characteristics of RF output signal 108 are dictated by the particular application. RF power amplifier 102 drives an RF antenna 110 for transmission of RF output signal 108. As mentioned above, RF antenna 110 represents an output load for RF power amplifier 102, and in operation the output impedance presented by RF antenna 110 may vary in response to changing operating, environmental, and other conditions. In other words, RF antenna 110 represents a potentially variable output load for RF power amplifier 102.

RF power amplifier circuit 100 preferably includes an RF coupler 112, which is suitably configured to obtain a coupled reflected signal 114 and a coupled incident signal 116 for output power control architecture 104. In practice, coupled reflected signal 114 is based upon a reflected component of RF output signal 108, while coupled incident signal 116 is based upon a forward incident component of RF output signal 108. No RF energy will reflect under ideal conditions where antenna 110 presents a matched output load for RF power amplifier 102. Under such ideal conditions, therefore, coupled reflected signal 114 will not be detected.

RF coupler 112 can be realized as a directional coupler having an incident port and a reflected port. In a practical implementation, RF coupler 112 can be integrated into an output harmonic filter for RF power amplifier 102, thus minimizing insertion loss and conserving physical space. RF coupler 112 may incorporate an RF transmission line that provides a suitable amount of coupling relative to RF output signal 108. For example, RF coupler 112 may be realized as a −20 dB coupler using any suitable construction.

Briefly, output power control architecture 104 is configured to adjust operating characteristics of RF power amplifier 102 in response to coupled reflected signal 114 (and, in this example embodiment, in response to coupled incident signal 116). Although not depicted in FIG. 1, output power control architecture 104 may include or communicate with suitable control or processing logic that influences its operation, sets initial parameter settings, or the like. Output power control architecture 104 is suitably configured to generate at least one control signal 118 for RF power amplifier 102, where the control signal(s) 118 have characteristics influenced by coupled reflected signal 114 (and, in this example embodiment, influenced by coupled incident signal 116). As depicted in FIG. 1, output power control architecture 104 can generate any number (N) of control signals 118, where the actual number depends upon the particular application. Furthermore, a given control signal 118 may be a bias voltage, a bias current, a supply voltage, a supply current, or a digital control signal that influences bias or supply voltages or currents, and a given control signal 118 may be applied to any number of amplifier stages associated with RF power amplifier 102.

Output power control architecture 104 is suitably configured to adjust output power of RF power amplifier 102 in response to coupled reflected signal 114. Output power control architecture 104 is designed to dynamically adjust output power of RF power amplifier 102 to reduce the amplitude of the reflected component of RF output signal 108. For example, in response to the presence of a mismatch condition that causes RF signal reflection, circuit 100 can reduce the output power level to increase the linearity of RF power amplifier 102. Circuit 100 may utilize different methodologies to carry out the output power adjustment. For example, output power control architecture 104 may be suitably configured to: adjust biasing of RF power amplifier 102 in response to coupled reflected signal 114; adjust gain of RF power amplifier 102 in response to coupled reflected signal 114; adjust linearity of RF power amplifier 102 in response to coupled reflected signal 114; or the like.

Figure 2:
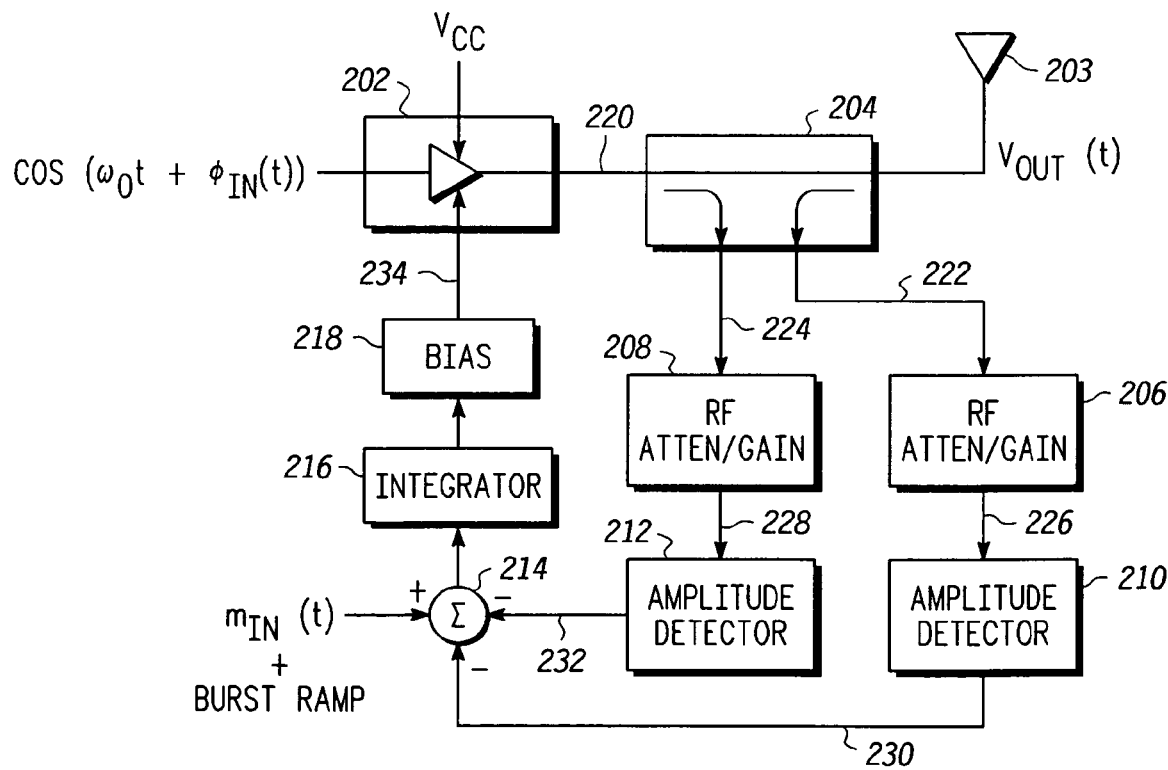
FIG. 2 is a schematic representation of a full polar RF power amplifier circuit configured in accordance with an example embodiment of the invention.

In one practical embodiment of the invention, power amplifier 102 is realized as a full polar amplifier. In this regard, FIG. 2 is a schematic representation of a full polar RF power amplifier circuit 200 configured in accordance with an example embodiment of the invention. Circuit 200 is a highly simplified diagram illustrating one preferred architecture for implementing a full polar power amplifier with a closed loop output power control feature. Circuit 200 is suitable for use in transmitters of cell phones supporting, for example, EDGE/GSM standards. The following description summarizes the general operation of the full polar amplifier.

The input RF signal to be amplified can be written in terms of amplitude envelope (m(t)) and phase ($\Phi(t)$) constituents: $V_{in}(t)=m_{in}(t)\cos(\omega_o t+\Phi_{in})(t))$.

As illustrated in FIG. 2, the phase modulated RF carrier (without amplitude modulation) is applied at the input of the RF power amplifier. The amplitude constituent is applied through a summing junction to modulate the biases of the amplifier stages, thereby reconstituting the envelope on the phase modulated signal. The signal at the output of the amplifier therefore takes the form: $V_{out}(t)=m_{out}(t)\cos(\omega_o t+\Phi_{out}(t)+\Phi_{offset})$, where $\Phi_{offset}$ represents a phase offset caused by time delay through the RF power amplifier.

For the signal to be linearly amplified, the envelope and phase properties are maintained as follows:

$V_{out}(t)/V_{in}(t)=K$, where $K$ is a constant $\Phi_{out}(t)=\Phi_{in}(t)+\Phi_{offset}$ For this architecture, the phase requirement (represented by the immediately preceding expression) is achieved by careful design of the RF power amplifier such that it inherently exhibits low AM-to-PM conversion. Preserving the envelope characteristics is achieved via the power control techniques described in more detail herein.

Circuit 200 addresses the issue of detecting and correcting the deleterious effects on amplifier performance resulting from antenna mismatch loading of the RF amplifier. Essentially, the antenna presents a load (of reflection coefficient $\Gamma_L$ at angle $\theta$) to the amplifier, and that load varies (both $\Gamma_L$ and angle $\theta$) due to various antenna and/or environmental effects. Antenna load effects are quantified in terms of VSWR presented at the output of the amplifier:

$$VSWR = \frac{1+|\Gamma_L|}{1-|\Gamma_L|}$$

Typical specifications require the amplifier to achieve a specified level of linearity in the presence of VSWR, typically up to 4:1 (for any angle θ from zero to 2π). In general, amplifier linearity suffers with increasing VSWR, and will be worse for a certain angle of θ. For EDGE modulation, both ORFS and EVM are typically cited linearity requirements, and both suffer with increasing VSWR loading.

In response to VSWR loading, an envelope feedback loop functions primarily to maintain constant incident power at the amplifier output. That is, the envelope of the output voltage ($m_{out}(t)$) is sampled, scaled, and then compared to the input envelope signal ($m_{in}(t)$). Hence, the load line presented to the amplifier (assuming infinite coupler directivity) varies from shallow to steep. Significant compressions of peak amplitude excursions occur (for certain load lines due to limited headroom of the amplifier) which then leads to an increase in ORFS and EVM. The situation is made worse when the coupler exhibits limited directivity. In a small foot print module environment, the directivity of such a coupler is on the order of 10 dB to 15 dB. Hence, the feedback signal generated by the coupler includes the vector sum of the incident wave plus a portion of the reflected signal (due to coupler directivity). When the signal phases are aligned, the feedback error voltage results in a drop of output power. Alternatively, when they are 180 degrees apart, the feedback error voltage drives the RF power amplifier further into compression leading to even higher levels of ORFS and EVM.

Referring again to FIG. 2, circuit 200 generally includes an RF power amplifier 202, an RF antenna 203, an RF coupler 204, a first RF attenuator/gain element 206, a second RF attenuator/gain element 208, a first amplitude detector 210, a second amplitude detector 212, a summer 214, an integrator 216, and a bias signal generator 218. In a practical embodiment, summer 214 and integrator 216 may be realized as a single element or component. The components depicted in FIG. 2 (other than RF power amplifier 202, RF antenna 203, and RF coupler 204) collectively may be considered to be an output power control architecture as described above in connection with circuit 100.

In this example embodiment, RF power amplifier 202 is a full polar amplifier that operates in the manner described above. As depicted in FIG. 2, the amplitude constituent of the RF input signal serves as one input to summer 214, and the phase constituent of the RF input signal serves as an input to RF power amplifier 202. RF power amplifier 202 is suitably configured to generate an RF output signal 220, which is utilized to drive RF antenna 203 in this example. RF coupler 204, which may be configured to operate as described above in connection with RF coupler 112, obtains a coupled reflected signal 222 associated with RF output signal 220 (along with a coupled incident signal 224 in this example). Coupled reflected signal 222 may serve as an input to RF attenuator/gain element 206, and coupled incident signal 224 may serve as an input to RF attenuator/gain element 208.

RF attenuator/gain element 206, which has an input coupled to RF coupler 204, is suitably configured to adjust the magnitude of coupled reflected signal 222 to a level appropriate for the current operating conditions. In practice, the amount of attenuation or gain provided by RF attenuator/gain element 206 may be influenced by the amount of attenuation or gain provided by RF attenuator/gain element 208. In addition, the amount of attenuation or gain provided by RF attenuator/gain element 206 is influenced by the amount of desired correction for RF power amplifier 202. RF attenuator/gain element 206 adjusts the level of coupled reflected signal 222 to increase the dynamic range of amplitude detector 210. In a practical embodiment, circuit 200 may utilize a suitable control scheme to initialize RF attenuator/gain elements 206/208 in accordance with the desired level for RF output signal 220.

Thereafter, the initial settings can be altered as the desired level for RF output signal 220 changes to suit the dynamic needs of the particular application.

In a practical embodiment of circuit 200, RF attenuator/gain element 206 is realized as an adjustable or programmable component having a suitable adjustment range for setting the average power level of coupled reflected signal 222. In one example embodiment, RF attenuator/gain element 206 provides 28 dB of programmable attenuation/gain. In operation, RF attenuator/gain element 206 is controlled to attenuate or amplify coupled reflected signal 222 as needed to set the loop parameters of circuit 200. Thus, RF attenuator/gain element 206 produces an attenuated/amplified RF signal 226. RF attenuator/gain element 208 is similarly configured to provide a desired amount of attenuation or gain for coupled incident signal 224, resulting in an attenuated/amplified RF signal 228.

Amplitude detector 210 has an input coupled to the output of RF attenuator/gain element 206. Amplitude detector 210 is suitably configured to quantify the amplitude of attenuated/amplified RF signal 226. Moreover, amplitude detector 210 is preferably configured to generate an adjustment signal 230 that is indicative of an output load mismatch for RF power amplifier 202. In the example embodiment, amplitude detector 210 is a linear amplitude detector that is capable of detecting a number of discrete amplitude levels corresponding to attenuated/amplified RF signal 226, where adjustment signal 230 is indicative of the particular amplitude level. Alternatively, amplitude detector 210 may be realized as a logarithmic detector. In practice, adjustment signal 230 may be a voltage signal, where the particular voltage level represents the detected amplitude of attenuated/amplified RF signal 226. Amplitude detector 212 is similarly configured to generate a second adjustment signal 232 indicative of the detected amplitude of attenuated/amplified RF signal 228.

Summer 214 adjusts the amplitude constituent of the RF input signal in response to adjustment signals 230/232. In this example, the output of summer 214 corresponds to the amplitude constituent of the RF input signal minus adjustment signals 230/232. The output of summer 214 may serve as an input to integrator 216, which is suitably configured to perform averaging or filtering of its input to obtain an average power level indication. In practice, integrator 216 can be realized as a gain stage that is also configured to provide a suitable amount of loop gain for circuit 200.

In this example, bias signal generator 218 is coupled to RF power amplifier 202 and to integrator 216. In this regard, bias signal generator 218 is also coupled to amplitude detectors 210/212. Briefly, bias signal generator 218 is configured to generate, in response to adjustment signal 230 (and in response to adjustment signal 232 in this example), at least one bias control signal 234 for RF power amplifier 202. Thus, bias control signal(s) 234 are generated in response to coupled reflected signal 222 and, in this example, in response to coupled incident signal 224. As described above, bias control signal(s) 234 influence the output power of RF power amplifier 202, and bias control signal(s) 234 may be realized as a bias voltage, a bias current, a supply voltage, a supply current, a digital control signal that influences bias or supply voltages or currents, or the like. Furthermore, multiple bias control signals 234 may be utilized to independently control separate stages of a practical RF power amplifier 202. Circuit 200 may utilize different methodologies to carry out the output power adjustment. For example, bias signal generator 218 may be suitably configured to: adjust biasing of RF power amplifier 202 in response to coupled reflected signal 222; adjust gain of RF power amplifier 202 in response to coupled reflected signal 222; adjust linearity of RF power amplifier 202 in response to coupled reflected signal 222; or the like.

In operation, if RF antenna 203 presents an ideal 50 Ohm termination for RF power amplifier 202, then coupled reflected signal 222 has no measurable amplitude and, therefore, the loop is unaffected. Under high VSWR conditions, however, the amplitude of coupled reflected signal 222 is proportional to the VSWR and to the output power level. Circuit 200 detects coupled reflected signal 222 and generates a feedback voltage in the form of adjustment signal 230. The higher feedback voltage in the loop has the effect of reducing the drive on the bias controls of RF power amplifier 202. Consequently, RF power amplifier 202 is driven less deeply into compression, resulting in an improvement in linearity.

Figure 3:
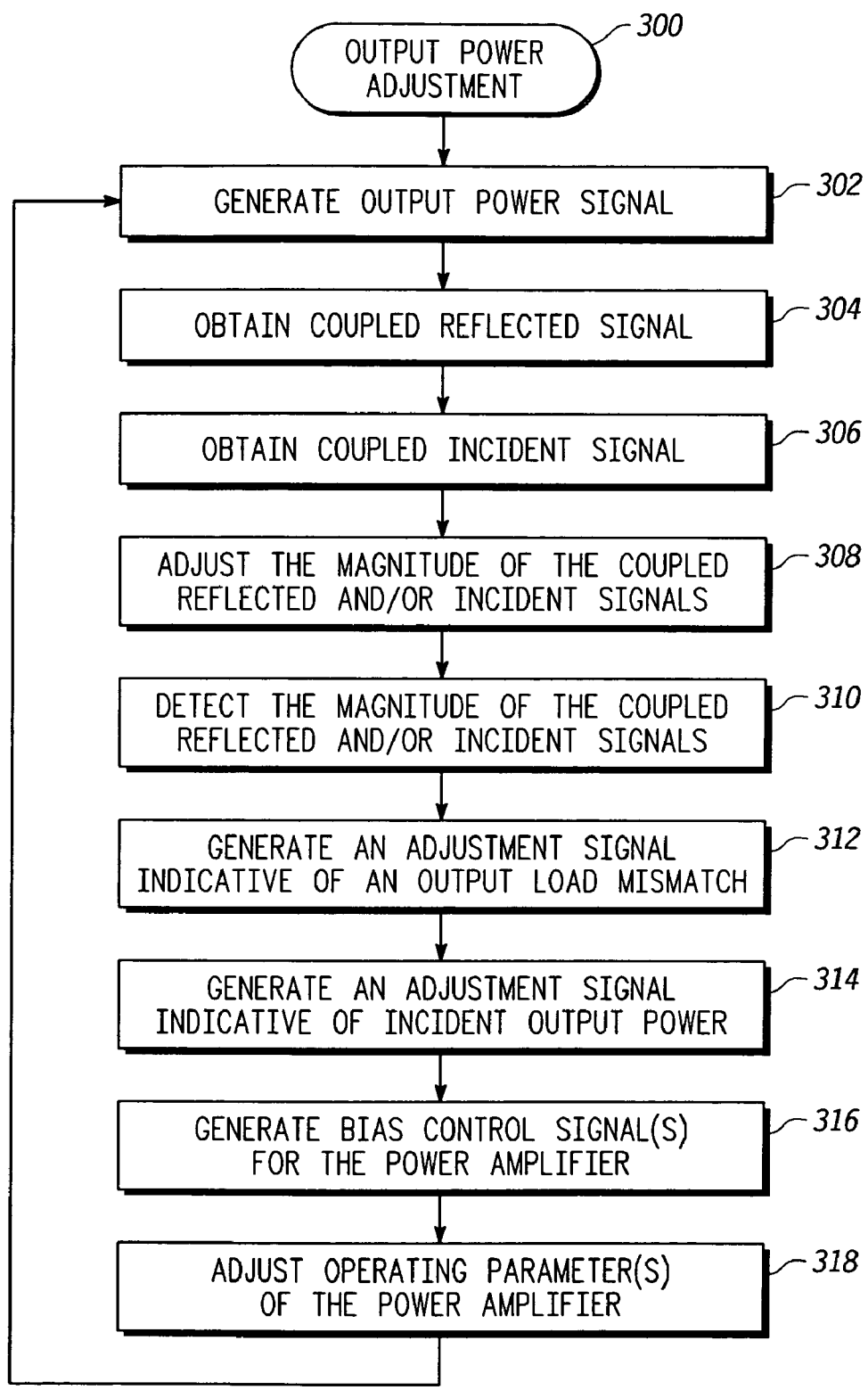
FIG. 3 is a flow chart of an output power adjustment process according to an example embodiment of the invention.

FIG. 3 is a flow chart of an output power adjustment process 300 according to an example embodiment of the invention. Process 300 may be performed by an RF electronic circuit as described above. The various tasks performed in connection with process 300 may be performed by software, hardware, firmware, or any combination thereof. For illustrative purposes, the following description of process 300 may refer to elements mentioned above in connection with FIG. 1 and FIG. 2. In practical embodiments, portions of process 300 may be performed by different elements of the described system, e.g., the power amplifier, the RF coupler, or the output power control architecture. It should be appreciated that process 300 may include any number of additional or alternative tasks, the tasks shown in FIG. 3 need not be performed in the illustrated order, and process 300 may be incorporated into a more comprehensive procedure or process having additional functionality not described in detail herein.

Process 300 may begin by generating a suitable RF output power signal (task 302) with a power amplifier. Generally, process 300 detects the presence of an output load mismatch using techniques described above. For example, process 300 may obtain a coupled reflected signal that is based upon a reflected component of the RF output signal (task 304). In this example, process 300 also obtains a coupled incident signal that is based upon the forward transmit component of the RF output signal (task 306). Process 300 continues by adjusting the magnitude of the coupled reflected signal and/or the magnitude of the coupled incident signal (task 308), and by detecting the magnitude of the coupled signals (task 310). As described above, the circuit may utilize one or more programmable attenuation/gain elements to perform task 308.

Process 300 may also generate an adjustment signal that is indicative of an output load mismatch (task 312). In practice, this adjustment signal may be generated in response to the adjusted coupled reflected signal resulting from task 308. In addition, process 300 may generate another adjustment signal that is indicative of the incident output power of the RF output signal (task 314). In practice, this adjustment signal may be may be generated in response to the adjusted coupled incident signal resulting from task 308. These adjustment signals may be utilized to generate at least one bias control signal for the power amplifier (task 316), where the bias control signals have characteristics that are influenced by the coupled reflected signal and/or by the coupled incident signal. Eventually, process 300 adjusts operating characteristics of the power amplifier in response to the coupled reflected signal and/or in response to the coupled incident signal (task 318). In practice, task 318 may adjust the output power level of the power amplifier using the techniques described in more detail above.

In summary, systems, devices, and methods configured in accordance with example embodiments of the invention relate to:

An RF electronic device comprising a power amplifier configured to generate an RF output signal, an RF coupler configured to obtain a coupled reflected signal based upon a reflected component of the RF output signal, and an output power control architecture coupled to the power amplifier and to the RF coupler, the output power control architecture being configured to adjust operating characteristics of the power amplifier in response to the coupled reflected signal. The output power control architecture may be configured to adjust output power of the power amplifier in response to the coupled reflected signal. The output power control architecture may be configured to adjust output power of the power amplifier to reduce amplitude of the reflected component. The output power control architecture may be configured to adjust biasing of the power amplifier in response to the coupled reflected signal. The output power control architecture may be configured to adjust gain of the power amplifier in response to the coupled reflected signal. The output power control architecture may be configured to adjust linearity of the power amplifier in response to the coupled reflected signal. The RF coupler may be configured to obtain a coupled incident signal based upon the RF output signal, and the output power control architecture may be configured to adjust operating characteristics of the power amplifier in response to the coupled incident signal. The power amplifier may be a closed loop polar feedback amplifier. The output power control architecture may comprise an adjustable RF attenuator/gain element configured to adjust magnitude of the coupled reflected signal. The output power control architecture may be configured to generate at least one control signal for the power amplifier, the at least one control signal having characteristics influenced by the coupled reflected signal.

A method of adjusting output power of an RF power amplifier configured to generate an RF output signal, the method comprising detecting the presence of an output load mismatch, obtaining a coupled reflected signal based upon a reflected component of the RF output signal, and adjusting operating characteristics of the RF power amplifier in response to the coupled reflected signal. Adjusting operating characteristics of the RF power amplifier may comprise adjusting biasing of the RF power amplifier. Adjusting operating characteristics of the RF power amplifier may comprise adjusting gain of the RF power amplifier. The method may further comprise obtaining a coupled incident signal based upon the RF output signal, wherein adjusting operating characteristics of the RF power amplifier is responsive to the coupled incident signal. The method may further comprise adjusting the magnitude of the coupled reflected signal. The method may further comprise generating at least one control signal for the RF power amplifier, the at least one control signal having characteristics influenced by the coupled reflected signal.

An RF electronic device comprising a power amplifier configured to generate an RF output signal, an RF coupler configured to obtain a coupled reflected signal based upon a reflected component of the RF output signal, an amplitude detector coupled to the RF coupler, the amplitude detector being configured to generate an adjustment signal indicative of an output load mismatch, and a bias signal generator coupled to the amplitude detector, the bias signal generator being configured to generate, in response to the adjustment signal, at least one bias control signal for the power amplifier. The RF electronic device may further comprise an RF antenna coupled to the power amplifier, the RF antenna representing a potentially variable output load for the power amplifier. The at least one bias control signal influences output power of the power amplifier. The RF coupler may be configured to obtain a coupled incident signal based upon the RF output signal, and the bias signal generator may be configured to generate the at least one bias control signal in response to the coupled incident signal.

While at least one example embodiment has been presented in the foregoing detailed description, it should be appreciated that a vast number of variations exist. For example, circuit techniques in the digital domain can be utilized to produce equivalent RF electronic circuits. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A radio frequency ("RF") electronic device comprising:
a power amplifier configured to generate an RF output signal;
an RF coupler configured to obtain a coupled incident signal based upon said RF output signal and a coupled reflected signal based upon a reflected component of said RF output signal; and
an output power control architecture coupled to said power amplifier and to said RF coupler, said output power control architecture being configured to adjust operating characteristics of said power amplifier in response to said coupled reflected signal, wherein said output power control architecture generates a first adjustment signal from said coupled incident signal, said output power control architecture generates a second adjustment signal from said coupled reflected signal, and adjusts the operating characteristics of said power amplifier with a control signal obtained by subtracting said first adjustment signal and said second adjustment signal from a constituent component of an RF input to said power amplifier.

2. An RF electronic device according to claim 1, said output power control architecture being configured to adjust output power of said power amplifier in response to said control signal.

3. An RF electronic device according to claim 2, said output power control architecture being configured to adjust output power of said power amplifier to reduce amplitude of said reflected component.

4. An RF electronic device according to claim 1, said output power control architecture being configured to adjust biasing of said power amplifier in response to said control signal.

5. An RF electronic device according to claim 1, said output power control architecture being configured to adjust gain of said power amplifier in response to said control signal.

6. An RF electronic device according to claim 1, said output power control architecture being configured to adjust linearity of said power amplifier in response to said control signal.

7. An RF electronic device according to claim 1, said power amplifier being a closed loop polar feedback amplifier, said constituent component of said RF input being an amplitude constituent of said RF input, and said power amplifier being configured to process a phase constituent of said RF input.

8. An RF electronic device according to claim 1, said output power control architecture comprising an adjustable RF attenuator/gain element configured to adjust magnitude of said coupled reflected signal.

9. An RF electronic device according to claim 1, said output power control architecture being configured to generate at least one control signal for said power amplifier, said at least one control signal having characteristics influenced by said coupled reflected signal.

10. A method of adjusting output power of a radio frequency ("RF") power amplifier configured to generate an RF output signal, said method comprising:
obtaining a coupled incident signal based upon an incident component of said RF output signal;
obtaining a coupled reflected signal based upon a reflected component of the RF output signal;
generating a first adjustment signal from said coupled incident signal;
generating a second adjustment signal from said coupled reflected signal;
subtracting said first adjustment signal and said second adjustment signal from an amplitude constituent of an RF input signal, resulting in an adjusted amplitude constituent signal; and
adjusting operating characteristics of the RF power amplifier in response to said adjusted amplitude constituent signal.

11. A method according to claim 10, wherein adjusting operating characteristics of the RF power amplifier comprises adjusting biasing of the RF power amplifier.

12. A method according to claim 10, wherein adjusting operating characteristics of the RF power amplifier comprises adjusting gain of the RF power amplifier.

13. A method according to claim 10, further comprising adjusting the magnitude of said coupled reflected signal.

14. A method according to claim 10, further comprising generating at least one control signal for the RF power amplifier, said at least one control signal having characteristics influenced by said adjusted amplitude constituent signal.

15. A radio frequency ("RF") electronic device comprising:
a power amplifier configured to generate an RF output signal from a phase constituent of an RF input signal;
an RF coupler configured to obtain a coupled incident signal based upon an incident component of said RF output signal, and a coupled reflected signal based upon a reflected component of said RF output signal;
a first amplitude detector coupled to said RF coupler, said first amplitude detector being configured to generate a first adjustment signal from said coupled reflected signal, said first adjustment signal being indicative of an output load mismatch;
a second amplitude detector coupled to said RF coupler, said second amplitude detector being configured to generate a second adjustment signal from said coupled incident signal;
a summer coupled to said first amplitude detector and to said second amplitude detector, said summer being configured to subtract said first adjustment signal and said second adjustment signal from an amplitude constituent of said RF input signal, resulting in an adjusted amplitude constituent signal; and a bias signal generator coupled to said summer, said bias signal generator being configured to generate, in response to said adjusted amplitude signal, at least one bias control signal for said power amplifier.

16. An RF electronic device according to claim 15, further comprising an RF antenna coupled to said power amplifier, said RF antenna representing a potentially variable output load for said power amplifier.

17. An RF electronic device according to claim 15, said at least one bias control signal influencing output power of said power amplifier.

\* \* \* \* \*